Nov. 12, 1968 J. M. SCHILLER ET AL 3,411,122

ELECTRICAL RESISTANCE ELEMENT AND
METHOD OF FABRICATING
Filed Jan. 13, 1966

INVENTOR
JULIUS M. SCHILLER
MELVIN N. TURETZKY

BY Wolmar J. Stoffel
ATTORNEY

United States Patent Office 3,411,122
Patented Nov. 12, 1968

3,411,122
ELECTRICAL RESISTANCE ELEMENT AND METHOD OF FABRICATING

Julius M. Schiller and Melvin N. Turetzky, Poughkeepsie, N.Y., assignors to International Business Machines Corporation, Armonk, N.Y., a corporation of New York
Filed Jan. 13, 1966, Ser. No. 520,534
12 Claims. (Cl. 338—262)

ABSTRACT OF THE DISCLOSURE

An electrical resistance structure with an insulating base supporting a conductive layer of a finely divided metal and metal oxide, and a layer of a polyimide condensation product of a diamine and a tetracarboxylic acid or a tricarboxylic acid.

This invention relates to improved resistance elements for use in electrical circuits, and in particular to a resistance element having a laminated structure which element displays unexpected stability when exposed to environmental extremes, and methods of making such resistance elements.

Encapsulation of electrical components, including resistance elements, with organic resins is well known and widely practiced in the electrical industry. It is also well known to apply a relatively thin protective coating on electrical components, including resistance elements. These well known encapsulation and coating techniques are used to form a barrier over the components to thereby seal them against air, humidity, corrosive environments, etc. In general, the objective of the enclosing materials is to isolate the components from the environment which could cause deterioration of the component elements without influencing the electrical properties thereof.

In modern electronic circuitry, particularly microminiaturized electrical circuitry, it is important that the operating characteristics of the electrical components, for example, the resistance values of resistors, remain constant over long periods of time and exposure to temperature and other environmental variations. With the advent of active semiconductor elements with their inherent dependability, it is important that the dependability and stability of associated electrical elements be increased to match the dependability of these semiconductor elements.

A particular stability problem is presented by resistance elements. When resistance eelments are subjected to variations of temperature there occurs a resistance drift. Encapsulation or coating of the resistance elements, having as a component thereof a metal and/or metal oxide material, with conventional organic resins, does not sufficiently inhibit this resistance drift to meet the stringent requirements presented in modern electronic circuits.

It is an object of this invention to provide improved electrical resistance elements.

It is another object of this invention to provide electrical resistance elements which exhibit improved stability in operation.

Yet another object of this invention is to provide improved resistance elements that exhibit an unexpectedly small resistivity drift when exposed to temperature variations.

Another object of this invention is to provide an improved resistance element having as a component thereof a finely divided metal and/or metal oxide material with a novel coating which results in an unexpected inhibiting of drift characteristics when the resistance element is exposed to temperature extremes.

Still another object of this invention is to provide a resistance element having a mixture of metal and metal oxide conductive material with an organic coating which inhibits the resistance drift of the resistance elements.

Another object of this invention is to provide a method of fabricating improved resistors having an unexpected improvement in resistance drift characteristics.

Yet another object of this invention is to provide a method of fabricating an improved resistance element having as a component thereof a metal and metal oxide mixture and a novel coating which inhibits resistance drift of the resistor.

In accordance with the aforementioned objects the improved resistance element of the invention has an electrically nonconductive base with a conductive layer adhered to the base. The conductive layer has as a component thereof a finely divided metal and/or metal oxide material. Electrical terminals are provided on the base in electrical contact with the conductive layer. A bonded overlying layer is disposed on the conductive layer. The overlying layer is of a polymer material of a polyimide condensation product of a tetracarboxylic acid and a diamine, or a polyamide-polyimide condensation product of tricarboxylic acid and a diamine, or mixtures thereof.

The method of this invention of fabricating an improved resistance element on a nonconductive base involves forming a conductive layer by applying a layer of resistor paste on the base, which paste has as a component thereof a finely divided metal and/or metal oxide material and a vehicle. The resistor paste is subsequently fired and a thin layer of a polyimide precursor, or an amide modified polyimide precursor, or mixtures thereof applied over the resultant conductive layer. The resultant overlying layer is then heated to effect an imidization of the polymer.

The novel structure of the resistance element of the invention having a polyimide or amide modified polyimide coating results in an unexpected decrease in resistance drift. The aforementioned coating in combination with a conductive layer having as a component thereof a metal and/or metal oxide material, materially reduces drift and also provides a protective sealing function. Conventional organic resins generally provide only the sealing function which is separate and distinct from the thermal drift inhibiting function.

It is theorized that resistor drift in resistors, having a metal-metal oxide mixture as a component part in the conductive elements, is caused by changes in the metal-metal oxide ratio. This ratio is altered by environmental changes, such as temperature variations, which causes the formation of, or reduction of, the metal oxide via an oxidation equilibrium reaction. Merely sealing the resistor will not inhibit the oxidation reaction since it will not prevent metal oxide from being converted to oxygen and metal. A relatively small shift in the metal-metal oxide ratio can cause appreciable drift since the resistivity is governed to a large part by the ratio. The aforementioned coating in some manner, not completely understood, apparently has a stabilizing effect on the oxidation reaction within a metal-metal oxide conductive portion of the resistance element.

The foregoing and other objects, features and advantages of the invention will be apparent from the following more particular description of preferred embodiments of the invention as illustrated in the accompanying drawings.

Figure 1:
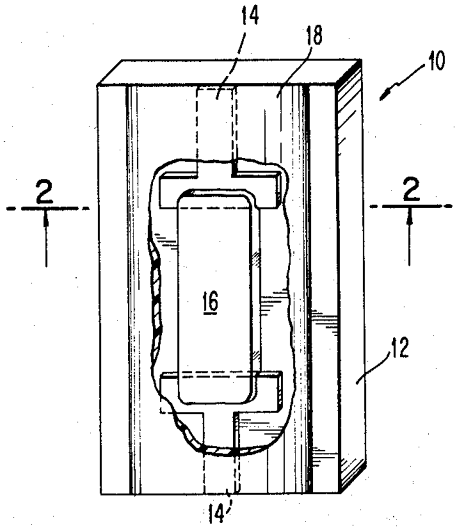
FIG. 1 is a view in perspective of a preferred specific embodiment of the electrical resistance element of the invention.
Figure 2:
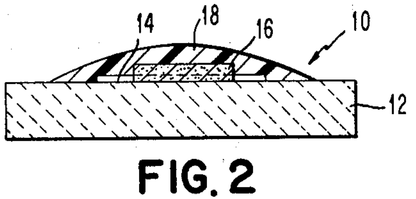
FIG. 2 is a cross sectional view taken on line 2—2 of FIG. 1.

Referring now to the drawings, FIGS. 1 through 4, there is illustrated in FIGS. 1 and 2 a preferred specific embodiment of the improved resistance element 10 of the invention. Element 10 has a base 12 of nonconductive material, such as alumina or the like. In practice, base 12 could be a module substrate having complete circuits mounted thereon including transistors, diodes, capacitors, resistors, inductors, lands, and the like. In the drawing only a single resistance element is shown mounted on the base or substrate in the interests of clarity of illustration. Electrical terminals 14 are mounted on base 12, which terminals are formed in the conventional manner, as for example by printing of electrode paste, or other solder wetting material and subsequently dipping the module into a solder bath. The terminals 14 will in practice be associated with the various electrical components of an electrical circuit. Disposed on base 12 and in electrical contact with the electrodes 14 is a conductor layer forming the actual conductive or resistance component of the resistance element. The conductive layer in the resistance element of the invention will include as a component thereof finely divided metal and/or metal oxide material. The conductive layer 16 can be printed on base 12 or applied in any suitable manner. Generally, the conductive layer 16 will have a thickness in the range of 0.5 to 2.0 mils. The most preferred specific embodiment of the resistance element has a conductive layer having as a component thereof a mixture of finely divided palladium and palladium oxide. The size and specific configuration of the conductive layer 16 is dictated by the physical and electrical characteristics of the electrical circuit in which the resistance element is used. An overlying layer 18 is bonded to conductive layer 16 as illustrated in FIGS. 1 and 2 of the drawings. Layer 18 is a polyimide polymer material characterized as a condensation product of a tetracarboxylic acid and a diamine, or a polyamide-polyimide condensation product of a tricarboxylic acid and a diamine, or mixtures of the two aforementioned condensation products. The combination of the aforedescribed conductive layer having as a component thereof a metal and/or metal oxide material, and the overlying layer of polymer material combine to form an improved resistance element that displays unexpected resistance drift stability when exposed to elevated temperatures, temperature variations and humid environments.

Figure 3:
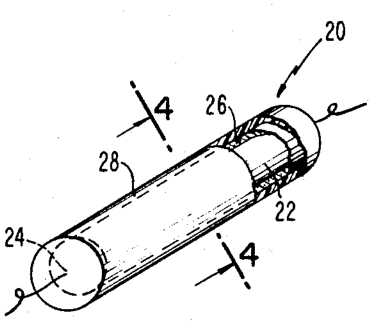
FIG. 3 is a perspective view of another preferred specific embodiment of the electrical resistance element of the invention.
Figure 4:
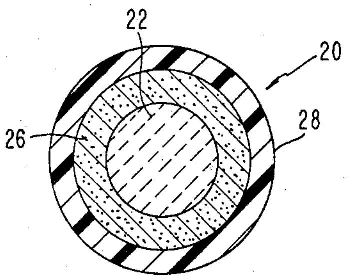
FIG. 4 is a cross sectional view taken on line 4—4 of FIG. 3.

Referring now to FIGS. 3 and 4 there is depicted another preferred specific embodiment of the improved resistance element 20 of the invention. Element 20 has a tubular configuration and is particularly adapted for use in conventional hand wired circuits or the like. Element 20 has a base or core 22 of nonconductive material, as for example ceramic, glass, or the like. Supported on opposite ends of base 22 are electrical terminals 24. A conductive layer 26 is adhered to the surface of base 22. The conductive layer is formed of a resistor paste having as a component thereof a finely divided metal and/or metal oxide material. The mixture of metal and metal oxide is normally adhered to the base 22 with a binder material. Preferred embodiments of the resistance element have a conductive layer having as a component thereof a finely divided mixture of palladium and palladium oxide, or indium oxide. An overlying layer 28 is bonded to conductive layer 26 as most clearly illustrated in FIG. 4 of the drawing. Overlying layer 28 is a polymer material characterized as a condensation product of tetracarboxylic acid and a diamine, or a polyamide-polyimide condensation product of a tricarboxylic acid and a diamine, or mixtures thereof.

The conductive layer in the resistance element of the invention contains as a component part thereof a mixture of the metal and/or metal oxide. An example of a typical electrical resistance paste suitable for use in the practice of our invention is a palladium-palladium oxide composition described and claimed in U.S. Ser. No. 313,032 filed Oct. 1, 1963 by Arthur H. Mones and Kenneth E. Neisser, Jr., now U.S. Patent 3,248,345 assigned to the assignee of the present application. This electrical resistor paste contains some 30–50% finely divided P-type semiconductor taken from the group consisting of palladium and indium as an active element, with the semiconductor doped with a cation taken from the group consisting of antimony and chromium, titanium and sodium, and 50–70% finely divided glass frit. In general, an electrical resistor paste which contains a metal or a metal oxide will upon firing contain a mixture of metal and metal oxide irrespective of whether the initial composition contained metal in pure form or metal oxide in pure form. Other commercially available resistor pastes which result in the formation of conductive layers having palladium and palladium oxide mixtures are Du Pont pastes bearing the designation 7826, 7828 and 7827. The specific paste compositions used in the resistor element of the invention are not part of the invention and therefore are not described in detail.

Another typical resistor paste suitable for use in the practice of the invention is an indium oxide resistor paste described and claimed in U.S. Ser. No. 378,921 filed June 29, 1964 by Murry L. Block and Arthur H. Mones, assigned to the assignee of the present invention. This resistor paste is described to contain 100–30% finely divided indium oxide, 0–60% borosilicate glass and 0–70% dopant.

The polyimide and polyamide-polyimide polymers utilized in the practice of this invention are well known to the art. These polymers per se do not constitute part of the invention. The novel aspect of this invention is the utilization of these polymers in combination with a specific type of resistor paste to form the resistor element. For purposes of this disclosure it will suffice to say that polyimides are prepared by reacting at least one organic diamine having the structural formula $$H_2N—R'—NH_2$$

wherein R′ is a divalent radical which can be aromatic in nature containing one or more benzene rings, a saturated cyclic radical, a linear unsaturated radical, or a saturated linear radical, with at least one tetracarboxylic acid dianhydride hving the structural formula

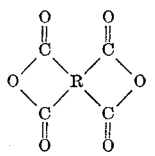

wherein R is a tetravalent aromatic organic radical preferably containing at least one ring of six carbon atoms. Typical diamines used to prepare polyimides are 4,4′-diaminodiphenyl propane, benzidine, 4,4′-diaminodiphenyl ether, 4,4′-diaminodiphenyl sulphone and meta-phenylene diamine. Typical tetracarboxylic acids are pyromellitic dianhydride, 3,4,3′,4′-benzophenone tetracarboxylic acid dianhydride, and 2,3,6,7 naphthalene tetracarboxylic acid dianhydride. Various types of polyimide polymers suitable for use in the practice of our invention are described in detail in U.S. Patents 3,179,631; 3,179,632; 3,179,633; and 3,179,634.

Polyamide-polyimide polymers suitable for use in the practice of our invention are also known in the art and do not constitute per se a part of this invention. In general, the polyamide-polyimide polymer contains the repeating unit

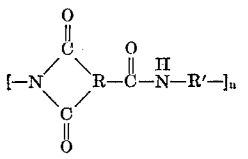

in which R represents a trivalent radical, perferably aromatic in nature. R′ has been described previously. The diamines used to prepare the polyamide-polyimide polymers are the same as given in regard to the polyimide polymers described previously. A typical tricarboxylic acid suitable for use in preparing the polyamide-polyimide polymers is trimellitic acid anhydride.

In the method of fabricating an improved resistance element on a nonconductive base of the invention, a layer of resistor paste is applied to the nonconductive base and subsequently fired. The resistor paste includes as a component thereof a finely divided metal and/or metal oxide material and a vehicle. The paste can also contain finely divided glass materials and other constituents common in the preparation of resistor pastes. The paste is applied in any suitable manner preferably through a masking element. A thin layer of a polyimide or polyamide-polyimide polymer is then formed over the fired resistor paste. In practice the polyimide or polyamide-polyimide constituents, namely the tri or tetracarboxylic acid and diamine are partially reacted and placed in a suitable solvent. The solvents useful in the solution polymerization process for synthesizing the intermediate polyamic-acid compositions in preparing the polyimide-polyamide are organic solvents whose functional groups do not react with either of the reactants to any appreciable extent. The typical compounds of solvents are N,N-dimethylformamide, N,N-dimethylacetamide, N-methyl-2-pyrollidone, dimethylsulfoxide, etc. The processes of producing partially reacted polyamide-polyimide polymers suitable for use in the practice of the invention are disclosed in U.S. Patent 3,179,634. After the partially reacted layer of polyamic acid in a solvent is applied over the conductive layer, the resistance element is heated, preferably in steps. The temperature is increased at each step. The temperature of the final heating step should equal or exceed the anticipated operating temperature variation extreme. This heating effects a cure which completes the polymerization of the polyamic acid converting it to the polyamide-polyimide polymer, and also evaporates the solvent and reaction by-products.

The following examples are set forth to illustrate specific embodiments and techniques in the practice of the invention and should not be construed to limit the scope of the invention.

Example I 75 ceramic substrates, each measuring approximately 0.5 by 0.5 inch and having a thickness of approximately 0.06 inch, were selected. Three resistors were printed on each module by a conventional silk screen process. The resistor paste used was a commercially available Du Pont paste designated 7826, which paste contained palladium, silver and glass binder. The three resistors were printed in varying sizes with the ends thereof in contact with a suitable electrical terminal. The modules were then fired at 760° C. for 45 minutes, whereupon the major portion of the palladium was either converted to palladium oxide or combined with the silver to form an alloy. The glass particles acted as a binder. One-fifth or 15 of the resultant modules were left uncoated to serve as a standard for comparison. One-fifth of the modules were coated with a commercially available polyimide polymer designated as "Pyre ML" produced by Du Pont Corporation. The modules were then heated for one-half hour at 100° C., one hour at 150° C., and finally one hour at 200° C. One-fifth of the modules were coated with an epichlorohydrin epoxy coating cured with an aromatic amine hardener; another fifth coated with a phenol-formaldehyde phenolic coating; and the final fifth coated with a linear polyester coating. The resistances of each of the resistors were carefully measured and recorded.

Five modules from each of the groups, namely the uncoated group, the polyimide coated group, the epoxy resin coated group, the phenolic resin coated group, and the polyester resin coated group, were placed in an oven heated to 100° C. and baked for 1000 hours. Five modules from each of the aforementioned groups were selected and placed in an oven heated to a temperature of 150° C. and baked for 1000 hours. Five modules of each of the aforementioned groups were placed in an oven heated to 200° C. and baked for 1000 hours. Resistance measurements were taken periodically at 168, 451, and 1000 hours. At the end of the 1000 hour period the resistance of each of the resistors in the respective groups was measured and a comparison made between the resistances measured initially before being placed in the oven. The average resistance drift and standard deviation of each group of five modules was then calculated and recorded in the following table:

TABLE I.—PERCENT DRIFT IN 1,000 HOURS

| Resistor Type | 100° C. | 150° C. | 200° C. |
|---|---|---|---|
| Uncoated | 0.31±0.08 | 0.96±.35 | 4.62±1.00 |
| Polyimide coated | 0.13±0.03 | 0.15±.03 | 1.02±0.16 |
| Epoxy coated* | —.12±.35 | —5.27±2.92 | —17.8±26.3 |
| Phenolic coated | 0.04±0.02 | 0.29±.14 | 2.22±.11 |
| Polyester coated* | .20±.29 | 1.57±1.52 | 3.46±3.02 |

During the test it was observed that the epoxy coated resistors and the polyester coated resistors (indicated by * in the table) exhibited such a large amount of resistance drift that the test on these groups was discontinued at the end of only 451 hours. The values given were obtained at the end of 451 hours. Thus, the uncoated resistors, the polyimide coated resistors, and the phenolic coated resistors were the only ones that remained the full 1000 hours. A comparison of the results indicates that the polyimide coated resistors displayed substantially less drift than either the uncoated or the phenolic resin coated resistors.

The modules containing the uncoated resistors, the modules containing the polyimide coated resistors, and the modules containing the phenolic resin coated resistors were then placed back in the ovens and heated for an additional 1000 hours. At the end of the heating period, the resistances of each of the modules were measured and the average resistance drifts from each group calculated. The resultant values are given in the following table:

TABLE II.—PERCENT DRIFT IN 2,000 HOURS

| Resistor Type | 100° C. | 150° C. | 200° C. |
|---|---|---|---|
| Uncoated | 0.40±0.10 | 1.8±0.46 | 8.0±3.6 |
| Polyimide coated | 0.16±0.05 | 0.48±0.15 | 2.34±0.4 |
| Phenolic coated | 0.03± .05 | 0.70±0.07 | 3.76±0.3 |

As the above table indicates the superiority the resistance elements of the invention in regard to minimizing drift is further emphasized, particularly at the higher test temperatures.

Similar tests were performed comparing various types of commercially available palladium-palladium oxide resistor pastes, namely a Du Pont paste designated 7828, and a generally similar palladium-palladium oxide paste described in U.S. Ser. No. 313,032. In each instance the resistance element with a metal-metal oxide conductive layer in combination with a polyimide polymer coating proved superior in reducing resistance drift. This is unexpected because the results could not be based on a consideration of permeability characteristics of the various polymers.

Further comparisons were made using different polyimide polymer coatings. The following commercially available polyimide polymer coatings were tested: Du Pont RC-W-98759, Du Pont PI-1101, Monsanto RS-5303, Monsanto RS-5305, Monsanto RS-5521 and Amoco AI-10. In all instances each of the aforementioned polyimide coatings in combination with a metal-metal oxide conductive layer was effective to inhibit resistance drift as compared to uncoated resistors and resistors coated with organic resins commonly utilized to encapsulate and coat electrical elements. The results of the tests wherein the polyimide coated resistors displayed materially less resistance drift could not be attributed solely to the sealing action of the coating. For example, an epoxy resin coating is materially less permeable than polyimide polymers, yet it was nowhere near as effective to reduce resistance drift as was the polyimide coating on the same resistor paste. The permeability of phenolic resins and also polyester resins is approximately that of polyimide polymers. The inhibiting of resistance drift by the polyimide coating used in combination with a metal-metal oxide resistor paste can be attributed to an inhibiting mechanism resulting from the aforementioned combination of a resistor paste and polyimide or polyamide-polyimide polymer which prevents or retards equilibrium reactions between the components of the resistor paste and/or reactions between the resistor paste and gases which diffuse through the coatings which would apparently otherwise change the chemical composition of the paste.

Example II

Fifteen substrates were selected and three resistances were printed on each substrate. The resistances were printed from an indium oxide resistor paste described in U.S. Ser. No. 378,921 and referred to previously. Five of the substrates were left uncoated. The resistors on five substrates were coated with a polyimide polymer coating which is commercially available and designated as Du Pont Pyre ML. The resistors on the remaining five modules were coated with a silicone resin. The modules were then placed in an environment maintained at 25° C. and at 95% relative humidity for a period of 1000 hours. At the end of the 1000 hour period the resistances of the modules were each measured, compared against the initial resistance values of the resistors and the resistance drift calculated. An average was taken of the resistance values of the resistors of each of the group of five modules and the following table prepared:

Table III

Percent drift in 1000 Hours at 25° C. and 95% R. H.

| Resistor type | |
|---|---|
| Uncoated | 1.47±.91 |
| Polyimide coated | .70±.27 |
| Silicone resin coated | 1.97±.99 |

As the above table indicates the resistor structure of the invention utilizing a polyimide coating in combination with an indium oxide resistor proved vastly superior to a conventional uncoated resistor and a silicone resin coated resistor in inhibiting drift under high humidity conditions.

While the invention has been particularly shown and described with reference to preferred embodiments thereof, it will be understood by those skilled in the art that the various changes in form and detail may be made therein without departing from the spirit and scope of the invention.

We claim:

1. An improved resistance element comprising, an electrically nonconductive base, a conductive layer adhered to said base having as a component thereof a material selected from the group consisting of a mixture of finely divided metal and metal oxide, a finely divided metal, and a finely divided metal oxide, electrical terminals in electrical contact with said conductive layer, and a bonded overlying layer on said conductive layer of a polymer material selected from the group consisting of a polyimide condensation product of a tetracarboxylic acid and a diamine, a polyamide-polyimide condensation product of a tricarboxylic acid and a diamine, and mixtures thereof.

2. The resistance element of claim 1 wherein said component of said conductive layer is a finely divided palladium-palladium oxide mixture.

3. The resistance element of claim 1 wherein said component of said conductive layer is a finely divided indium oxide mixture.

4. The resistance element of claim 1 wherein said polymer material of said bonded overlying layer is a polyimide condensation product of an aromatic tetracarboxylic acid dianhydride and a diamine.

5. The resistance element of claim 1 wherein said polymer material of said bonded overlying layer is a polyamide-polyimide condensation product of an aromatic tricarboxylic acid and a diamine.

6. The resistance element of claim 1 wherein said polymer material of said bonded overlying layer is a polyimide condensation product of pyromellitic acid dianhydride and m-phenylenediamine.

7. The resistance element of claim 1 wherein said polymer material of said bonded overlying layer is a polyamide-polyimide condensation product of trimellitic acid anhydride and m-phenylenediamine.

8. A method of fabricating an improved resistance element on a nonconductive base comprising (1) applying a layer of resistor paste, said resistor paste having as a component thereof a material selected from the group consisting of a finely divided metal-metal oxide material, a finely divided metal, and a finely divided metal oxide; (2) firing said layer of resistor paste; (3) applying a thin layer of a polyamic acid in a solvent over the resultant fired resistor paste, said polyamic acid produced by partially reacting a diamine and a compound selected from the group consisting of a tricarboxylic acid and a tetracarboxylic acid, or mixtures thereof; (4) heating the resultant laminated element thereby effecting further polymerization of said polyamic acid converting same to a polyimide condensation product and evaporating the solvent.

9. The method of claim 8 wherein said component of said resistor paste is a finely divided mixture of palladium and palladium oxide.

10. The method of claim 8 wherein said component of said resistor paste is a finely divided mixture of indium oxide.

11. The method of claim 8 wherein said component of said resistor paste is a finely divided metal-metal oxide material.

12. The resistive element of claim 1 wherein said component of said conductive layer is a mixture of finely divided metal and metal oxide.

References Cited

UNITED STATES PATENTS

| | | | |
|---|---|---|---|
| 2,635,994 | 4/1953 | Tierman | 338—309 X |
| 3,179,631 | 4/1965 | Endrey | 260—78 |
| 3,179,632 | 4/1965 | Hendrix | 260—78 |
| 3,179,633 | 4/1965 | Endrey | 260—78 |
| 3,179,634 | 4/1965 | Edwards | 260—78 |
| 3,248,345 | 4/1966 | Mones | 252—514 |

LEWIS H. MYERS, *Primary Examiner.*

ELLIOTT GOLDBERG, *Assistant Examiner.*